(12) United States Patent
Tang et al.

(10) Patent No.: US 10,157,834 B1
(45) Date of Patent: Dec. 18, 2018

(54) ELECTRONIC APPARATUS

(71) Applicant: Taiwan Semiconductor Manufacturing Co., Ltd., Hsinchu (TW)

(72) Inventors: Tzu-Chun Tang, Kaohsiung (TW); Chung-Hao Tsai, Changhua County (TW); Chen-Hua Yu, Hsinchu (TW); Chuei-Tang Wang, Taichung (TW); Che-Wei Hsu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/706,767

(22) Filed: Sep. 18, 2017

(51) Int. Cl.
| | | |
|---|---|---|
| *H01L 23/528* | (2006.01) | |
| *H01L 23/522* | (2006.01) | |
| *H01L 23/532* | (2006.01) | |
| *H01L 23/485* | (2006.01) | |
| *H01L 23/66* | (2006.01) | |
| *H01Q 1/22* | (2006.01) | |
| *H01L 23/31* | (2006.01) | |
| *H01L 23/00* | (2006.01) | |
| *H01L 21/66* | (2006.01) | |

(52) U.S. Cl.
CPC .......... *H01L 23/528* (2013.01); *H01L 23/485* (2013.01); *H01L 23/5226* (2013.01); *H01L 23/53228* (2013.01); *H01L 23/53233* (2013.01); *H01L 23/66* (2013.01); *H01Q 1/2283* (2013.01); *H01L 22/34* (2013.01); *H01L 23/3135* (2013.01); *H01L 23/3171* (2013.01); *H01L 24/03* (2013.01); *H01L 24/06* (2013.01); *H01L 24/14* (2013.01); *H01L 2221/68313* (2013.01); *H01L 2223/6616* (2013.01); *H01L 2223/6677* (2013.01); *H01L 2224/02331* (2013.01); *H01L 2224/02381* (2013.01); *H01L 2224/0401* (2013.01)

(58) Field of Classification Search
CPC ..... H01L 23/528; H01L 23/66; H01L 23/485; H01L 23/53233; H01L 23/53228; H01L 23/5226; H01L 24/06; H01L 23/3171; H01L 2224/02381; H01L 2223/6616; H01L 2223/6677; H01L 2224/02331; H01L 22/34; H01L 24/03; H01L 24/14; H01L 2224/0401; H01L 23/3135
See application file for complete search history.

(56) References Cited

U.S. PATENT DOCUMENTS

| | | | |
|---|---|---|---|
| 8,199,518 B1 * | 6/2012 | Chun ................ | H01L 23/49811 361/767 |
| 9,000,584 B2 | 4/2015 | Lin et al. | |
| 9,048,222 B2 | 6/2015 | Hung et al. | |
| 9,048,233 B2 | 6/2015 | Wu et al. | |

(Continued)

*Primary Examiner* — Marcos D Pizarro
*Assistant Examiner* — Nelson Garces
(74) *Attorney, Agent, or Firm* — JCIPRNET

(57) ABSTRACT

An electronic apparatus is provided. The electronic apparatus includes an integrated fan-out package, a dielectric housing, and a plurality of conductive patterns. The dielectric housing is covering the integrated fan-out package, wherein a gap or a first dielectric layer is in between the dielectric housing and the integrated fan-out package. The plurality of conductive patterns is located on a surface of the dielectric housing, wherein the plurality of conductive patterns is located in between the dielectric housing and the integrated fan-out package.

20 Claims, 18 Drawing Sheets

(56) References Cited

U.S. PATENT DOCUMENTS

| | | |
|---|---|---|
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2007/0176281 A1* | 8/2007 | Kim .................... H01L 23/3128 257/700 |
| 2009/0236700 A1* | 9/2009 | Moriya .................. H01L 23/29 257/659 |
| 2014/0035097 A1* | 2/2014 | Lin ....................... H01L 23/552 257/531 |
| 2018/0151518 A1* | 5/2018 | Shen ................... H01L 23/3135 |
| 2018/0205134 A1* | 7/2018 | Khan .................... H01Q 11/08 |

* cited by examiner

ELECTRONIC APPARATUS

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
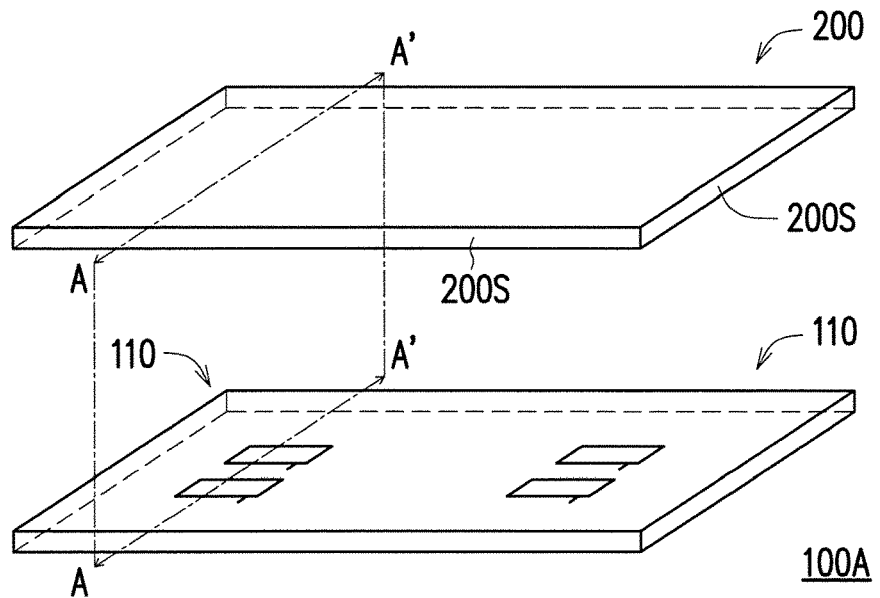
FIG. 1A is an exploded view illustrating an electronic apparatus according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A is an exploded view illustrating an electronic apparatus according to some exemplary embodiments of the present disclosure. As shown in FIG. 1A, in some embodiments, an electronic apparatus 100A may include a housing 200 and a module 110. The housing 200 is, for example, mechanically connected to the module 110 to constitute the electronic apparatus 100A. In some embodiments, the module 110 may include a circuit substrate and a package structure located on the circuit substrate (not shown), wherein the housing 200 is mechanically connected to the circuit substrate of the module 110 through the housing side walls 200S. In some embodiments, the electronic apparatus 100A are directed to cell phones or other mobile electronic equipment. However, the embodiments of the disclosure are not limited thereto, and the electronic apparatus 100A may be directed to other types of electronic equipment.

In exemplary embodiments, the housing 200 is, for example, a dielectric housing 200. A material of the dielectric housing may include transparent dielectric materials, light-transmissive dielectric materials, or dielectric materials that allows electromagnetic waves to propagate through. In some embodiments, the dielectric housing 200 is, for example, made of glass materials. However, the embodiments of the disclosure are not limited thereto. The embodiments are intended to provide further explanations but are not used to limit the scope of the present disclosure.

Figure 1B:
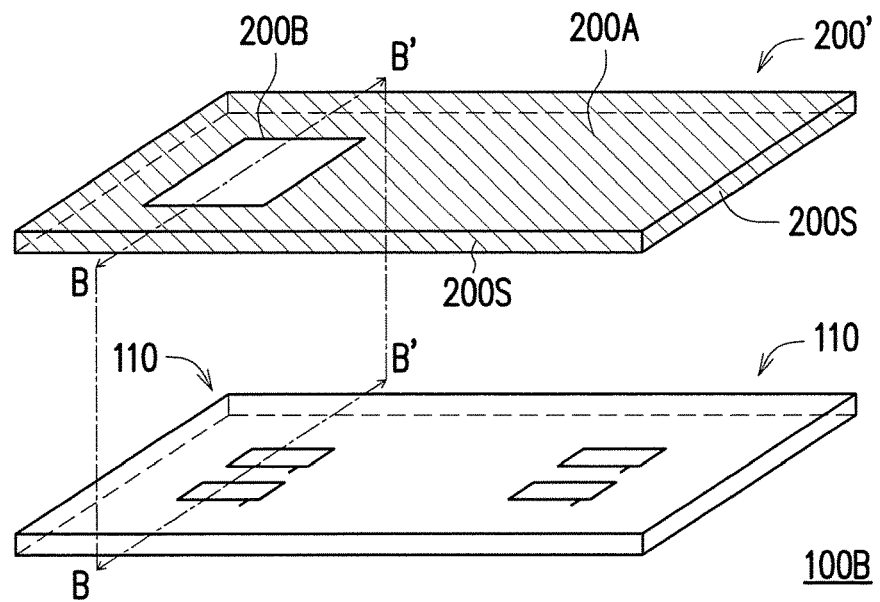
FIG. 1B is an exploded view illustrating an electronic apparatus according to some other exemplary embodiments of the present disclosure.

FIG. 1B is an exploded view illustrating an electronic apparatus according to some other exemplary embodiments of the present disclosure. As shown in FIG. 1B, in some embodiments, an electronic apparatus 100B may include a housing 200' and a module 110. Similar to the embodiment shown in FIG. 1A, the module 110 may include a circuit substrate and a package structure located on the circuit substrate (not shown), wherein the housing 200' is mechanically connected to the circuit substrate of the module 110 through the housing side walls 200S. The difference between the embodiment shown in FIG. 1B and the embodiment shown in FIG. 1A is in the design of the housing 200'.

In the exemplary embodiment, the housing 200', for example, includes a conductive housing 200A having a dielectric window 200B. In some embodiments, the conductive housing 200A is made of conductive materials such as metal. In some embodiments, the dielectric window 200B are transparent dielectric materials, light-transmissive dielectric materials, or dielectric materials that allows electromagnetic waves to propagate through. In certain embodiments, the dielectric window 200B is, for example, made of glass materials. In the exemplary embodiment, only one dielectric window 200B is shown, however, the embodiment is not used to limit the scope of the present disclosure. In alternative embodiments, a plurality of dielectric windows 200B may be provided based on design requirements.

The embodiments shown in FIG. 1A and FIG. 1B provides a structural outline of an electronic apparatus of the disclosure. The relationship between the housing (200/200') and the module 110 will be described in detail by referring to the embodiments shown in FIG. 2, FIGS. 4A-4D, FIG. 5 and FIGS. 6A-6D. The embodiments shown in FIG. 2, FIGS. 4A-4D, FIG. 5 and FIGS. 6A-6D are cross-sectional views of the electronic apparatus 100A taken along line A-A' of FIG. 1A, or alternatively, are cross-sectional views of the electronic apparatus 100B taken along line B-B' of FIG. 1B. That is, the design of the housing 200 (200') shown in FIG. 1A or FIG. 1B may apply to all of the embodiments shown in FIG. 2, FIGS. 4A-4D, FIG. 5 and FIGS. 6A-6D. In general, the cross-sectional views are taken along a portion of the dielectric housing 200 in FIG. 1A, or taken along a portion of the dielectric window 200B shown in FIG. 1B.

Figure 2:
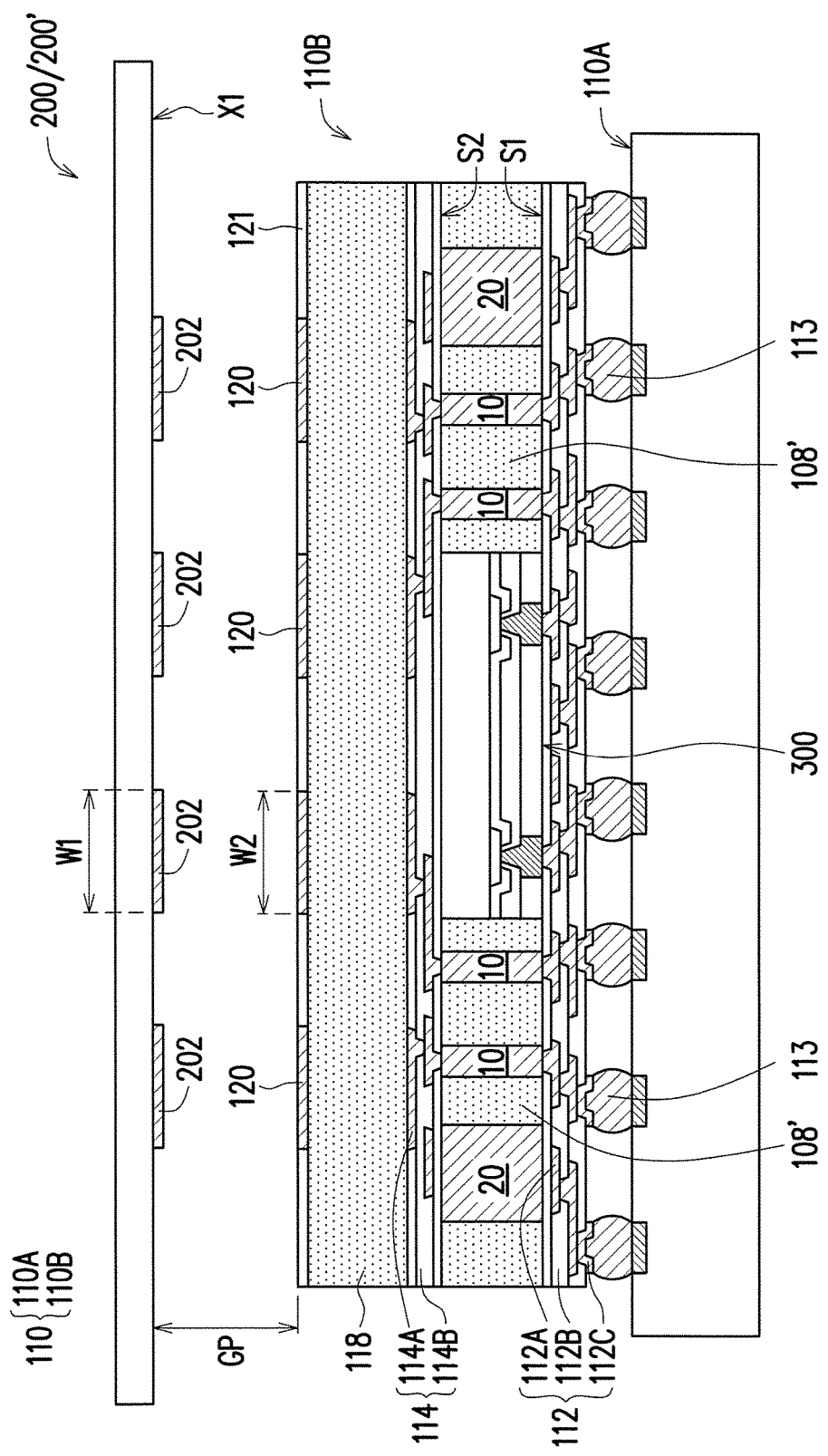
FIG. 2 is a schematic sectional view illustrating an electronic apparatus according to some exemplary embodiments of the present disclosure.

FIG. 2 is a schematic sectional view illustrating an electronic apparatus according to some exemplary embodiments of the present disclosure. As shown in FIG. 2, an electronic apparatus having an integrated fan-out package 110B, a circuit substrate 110A, and a housing (200/200') is provided. The integrated fan-out package 110B and the circuit substrate 110A constitute the module 110 shown in FIG. 1A and FIG. 1B. Furthermore, the housing (200/200') may correspond to the dielectric housing 200 of FIG. 1A or part of the dielectric window 200B in the housing 200' of FIG. 1B.

The manufacturing process of forming the module 110 shown in FIG. 2 can be referred to the embodiment shown in FIG. 3A to FIG. 3G. FIG. 3A to FIG. 3G are cross-sectional views schematically illustrating a process flow for fabricating a module in accordance with some embodiments of the present disclosure.

Figure 3A:
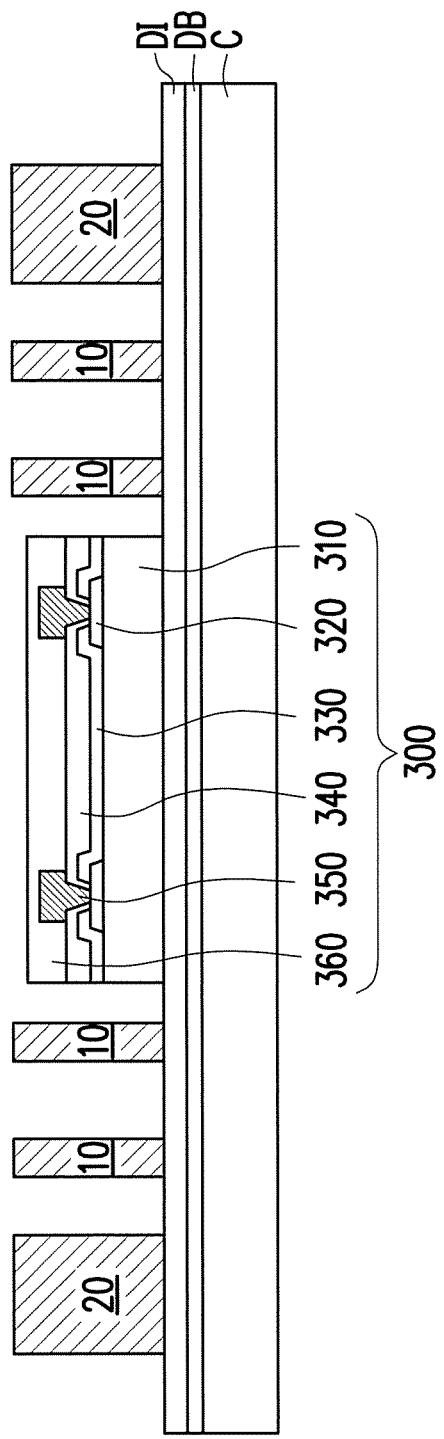
FIG. 3A to FIG. 3G are cross-sectional views schematically illustrating a process flow for fabricating a module in accordance with some embodiments of the present disclosure.

As shown in FIG. 3A, a carrier C having a de-bonding layer DB and a dielectric layer DI formed thereon is provided, wherein the de-bonding layer DB is located in between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB. After the carrier C having the de-bonding layer DB and the dielectric layer DI formed thereon is provided, a plurality of through insulator vias 10 and antennas 20 are formed on the dielectric layer DI. In some embodiments, the through insulator vias 10 are formed by photolithography, plating, photoresist stripping processes or any other suitable method. In one embodiment, the material of the through insulator vias 10 may include a metal material such as copper or copper alloys, or the like. In some embodiments, the antennas 20 may be dipole antennas.

In the exemplary embodiment, one semiconductor die 300 (or integrated circuit components) may be picked and placed on the dielectric layer DI. The semiconductor die 300, for example, includes a semiconductor substrate 310, a plurality of conductive pads 320, a passivation layer 330, a post passivation layer 340, a plurality of conductive vias 350, and a protection layer 360. In some embodiments, the plurality of conductive pads 320 are disposed over the semiconductor substrate 310. The passivation layer 330 is formed over the semiconductor substrate 110 and have contact openings that partially expose the conductive pads 320. The semiconductor substrate 310 may be a silicon substrate including active components (e.g., transistors or the like) and passive components (e.g., resistors, capacitors, inductors or the like) formed therein. The conductive pads 320 may be aluminum pads, copper pads or other suitable metal pads. The passivation layer 330 may be a silicon oxide layer, a silicon nitride layer, a silicon oxy-nitride layer or a dielectric layer formed by other suitable dielectric materials.

Furthermore, the post-passivation layer 340 is formed over the passivation layer 330. The post-passivation layer 340 covers the passivation layer 330 and has a plurality of contact opening. The conductive pads 320 are partially exposed by the contact opening of the post passivation layer 340. The post-passivation layer 340 may be a polyimide (PI) layer, a polybenzoxazole (PBO) layer, or a dielectric layer formed by other suitable polymers. In addition, a plurality of conductive pillars or conductive vias 350 are formed on the conductive pads 320. In some embodiments, the conductive pillars or conductive vias 350 are plated on the conductive pads 320. The protection layer 360 is formed on the post passivation layer 340 so as to cover the conductive pillars or conductive vias 350.

In some embodiments, the semiconductor die 300 is attached (or adhered) on the dielectric layer DI through a die attach film (not shown). In some alternative embodiments, more than one of the semiconductor die 300 may be picked and placed on the dielectric layer DI, wherein the semiconductor die 300 placed on the dielectric layer DI may be arranged in an array. When the semiconductor dies 300 placed on the dielectric layer DI are arranged in an array, the through insulator vias 10 may be classified into groups. The number of the semiconductor die 300 may correspond to the number of the groups of the through insulator vias 10. In the illustrated embodiment, one or more of the semiconductor die 300 may be picked and placed on the dielectric layer DI after the formation of the through insulator vias 10. However, the disclosure is not limited thereto. In some alternative embodiments, one or more of the semiconductor die 300 may be picked and placed on the dielectric layer DI before the formation of the through insulator vias 10.

Figure 3B:
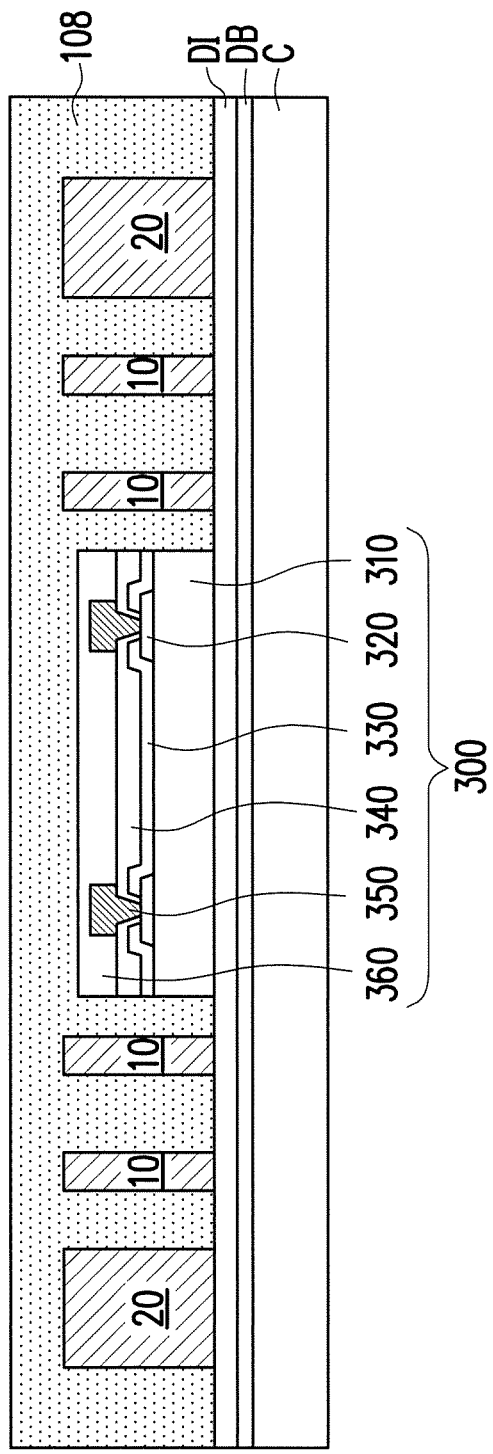

Referring to FIG. 3B, an insulating material 108 is formed on the dielectric layer DI through, for example, a compression molding process so as to encapsulate the semiconductor die 300, the through insulator vias 10 and the antennas 20. The conductive pillars or conductive vias 350 and the protection layer 360 of the semiconductor die 300 are encapsulated by and well protected by the insulating material 108. In other words, the conductive pillars or conductive vias 350 and the protection layer 360 of the semiconductor die 300 are not revealed and are well protected by the insulating material 108. In some embodiments, the insulating material 108 includes epoxy or other suitable resins.

Figure 3C:
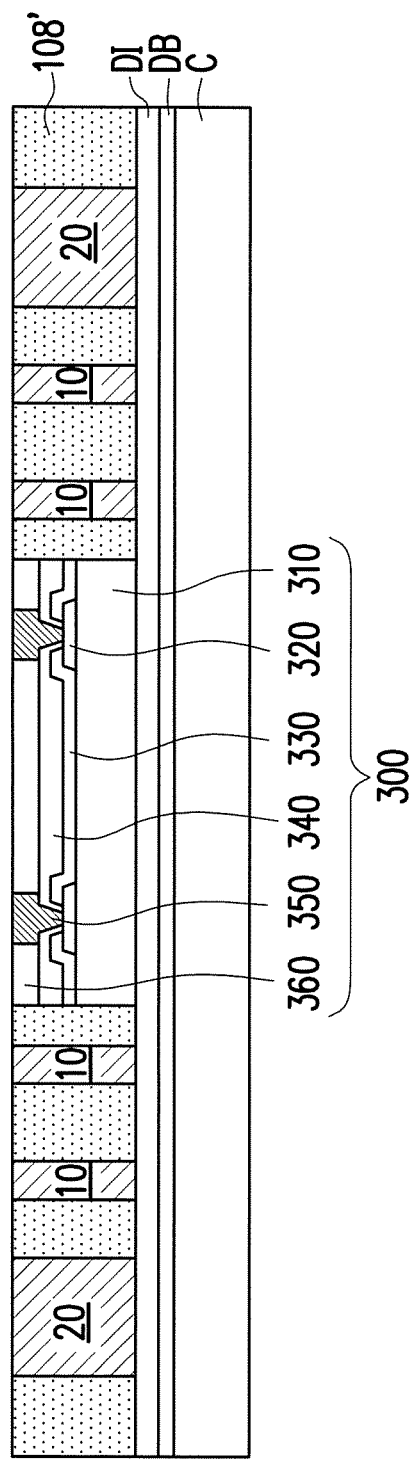

Referring to FIG. 3C, the insulating material 108 is grinded until the top surfaces of the conductive pillars 350, the top surfaces of the through insulator vias 10, the top surfaces of the antennas 20, and the top surface of the protection layer 360 are exposed. In some embodiments, the insulating material 108 is grinded by a mechanical grinding process and/or a chemical mechanical polishing (CMP) process. After the insulating material 108 is grinded, an insulating encapsulation 108' is formed over the dielectric layer DI. In some embodiments, during the grinding process of the insulating material 108, the protection layer 360 is grinded to reveal the conductive pillars or conductive vias 350. In some embodiments, portions of the through insulator vias 10, portions of the antennas 20 and portions of the conductive pillars 350 are slightly grinded also.

Figure 3D:
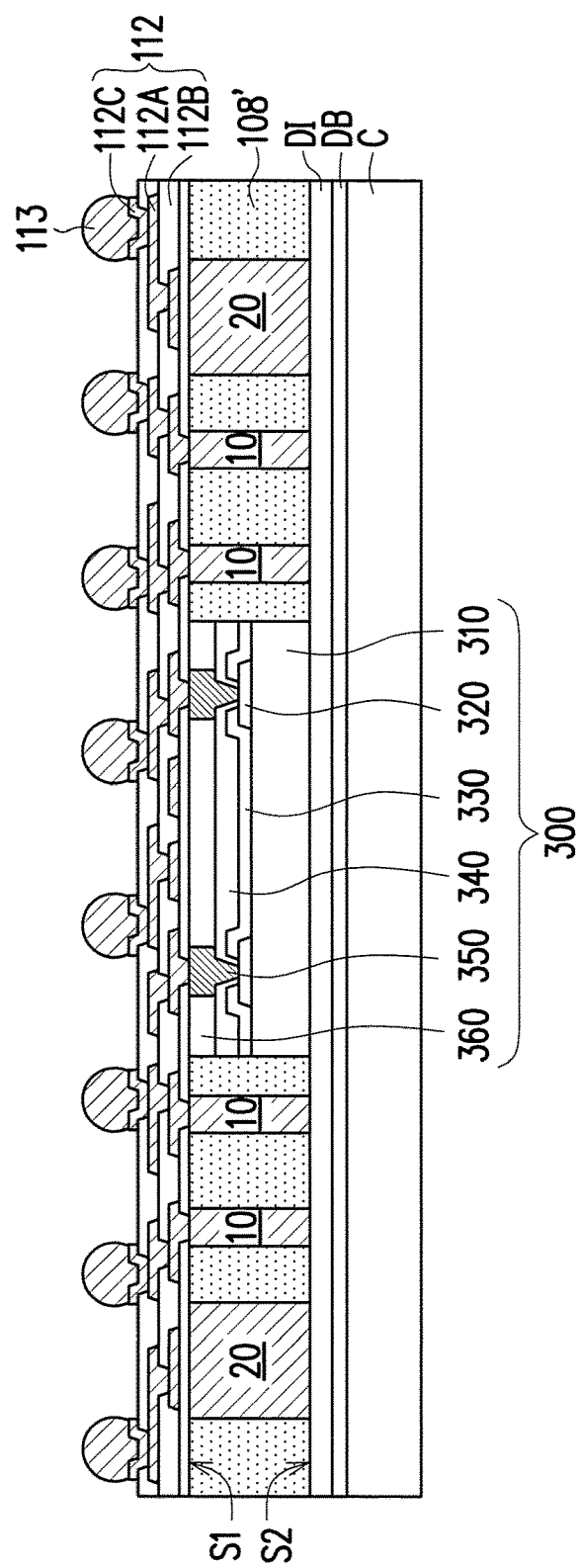

Referring to FIG. 3D, after the grinding process, a first redistribution layer 112 is formed on a first surface S1 of the insulating encapsulation 108'. In some embodiments, the first redistribution layer 112 includes a plurality of inter-dielectric layers 112B and a plurality of conductive layers 112A stacked alternately. The conductive layers 112A are electrically connected to the conductive pillars 350 of the semiconductor die 300 and the through insulator vias 10 embedded in the insulating encapsulation 108'. After forming the first redistribution layer 112, a plurality of conductive balls 113 may be placed on the first redistribution layer 112. In some embodiments, the topmost inter-dielectric layers 112B of the first redistribution layer 112 may include a plurality of conductive pads 112C. The conductive pads 112C are for example, under-ball metallurgy (UBM) patterns used for ball mount. In certain embodiments, the conductive balls 113 are placed on the conductive pads 112C through a ball placement process.

Figure 3E:
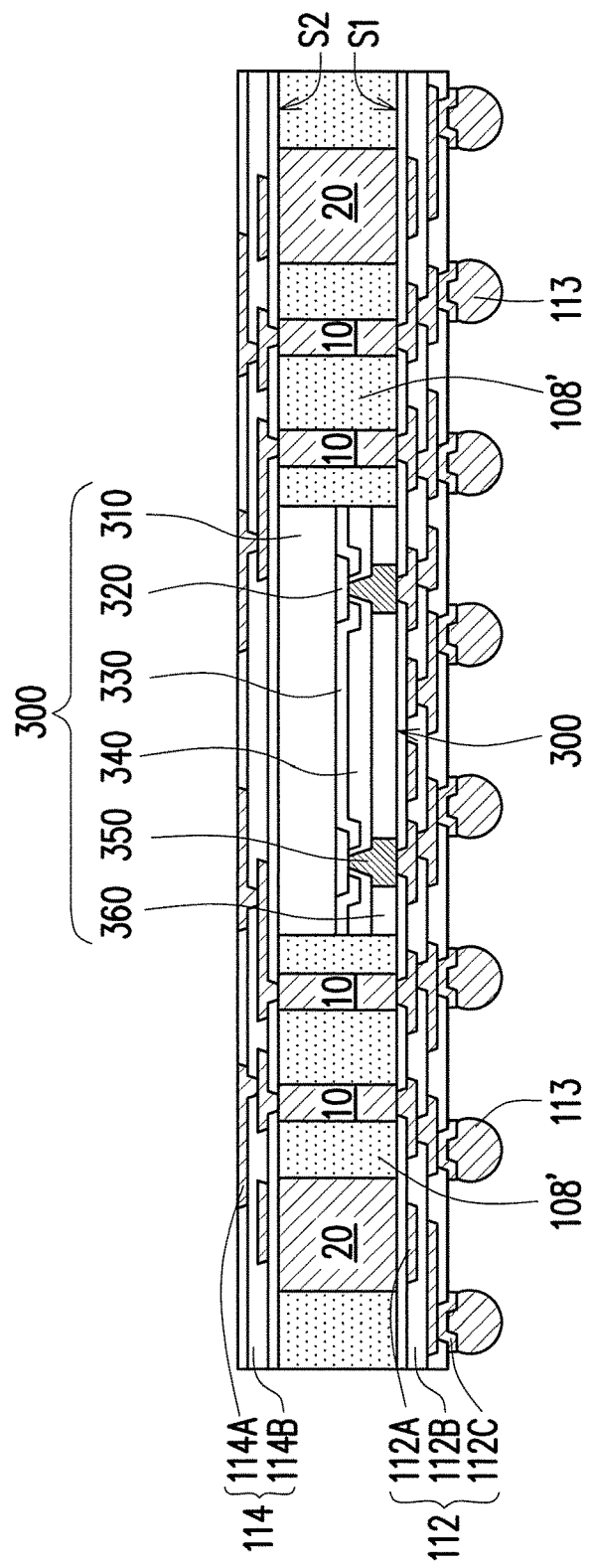

Referring to FIG. 3E, after the conductive balls 113 are placed on the first redistribution layer 112, the dielectric layer DI formed on the second surface S2 of the insulating encapsulant 108' is delaminated from the de-bonding layer DB such that dielectric layer DI is de-bonded from the de-bonding layer DB and the carrier C. In some embodiments, the carrier C is flipped (turned upside down) before the dielectric layer DI is de-bonded from the de-bonding layer DB. In some embodiments, the de-bonding layer DB (e.g. LTHC release layer) is irradiated by UV laser such that the dielectric layer DI can be de-bonded from the carrier C. In certain embodiments, the dielectric layer DI may be patterned and be used as inter-dielectric layers of a second redistribution layer. In alternative embodiments, the dielectric layer DI may be removed in a subsequent process.

Referring still to FIG. 3E, after de-bonding the carrier C, a second redistribution layer 114 is formed on the second surface S2 of the insulating encapsulant 108'. The second redistribution layer 114, for example, includes a plurality of inter-dielectric layers 114B and a plurality of conductive layers 114A stacked alternately. The number of stacked conductive layers 114A and inter-dielectric layers 114B may be adjusted based on actual requirement. In some embodiments, the conductive layers 114A of the second redistribution layer 114 may serve as feed lines for antennas formed thereafter. In alternative embodiments, the conductive layers 114A of the second redistribution layer 114 are electrically connected to antennas formed thereafter using feed lines (not shown).

Figure 3F:
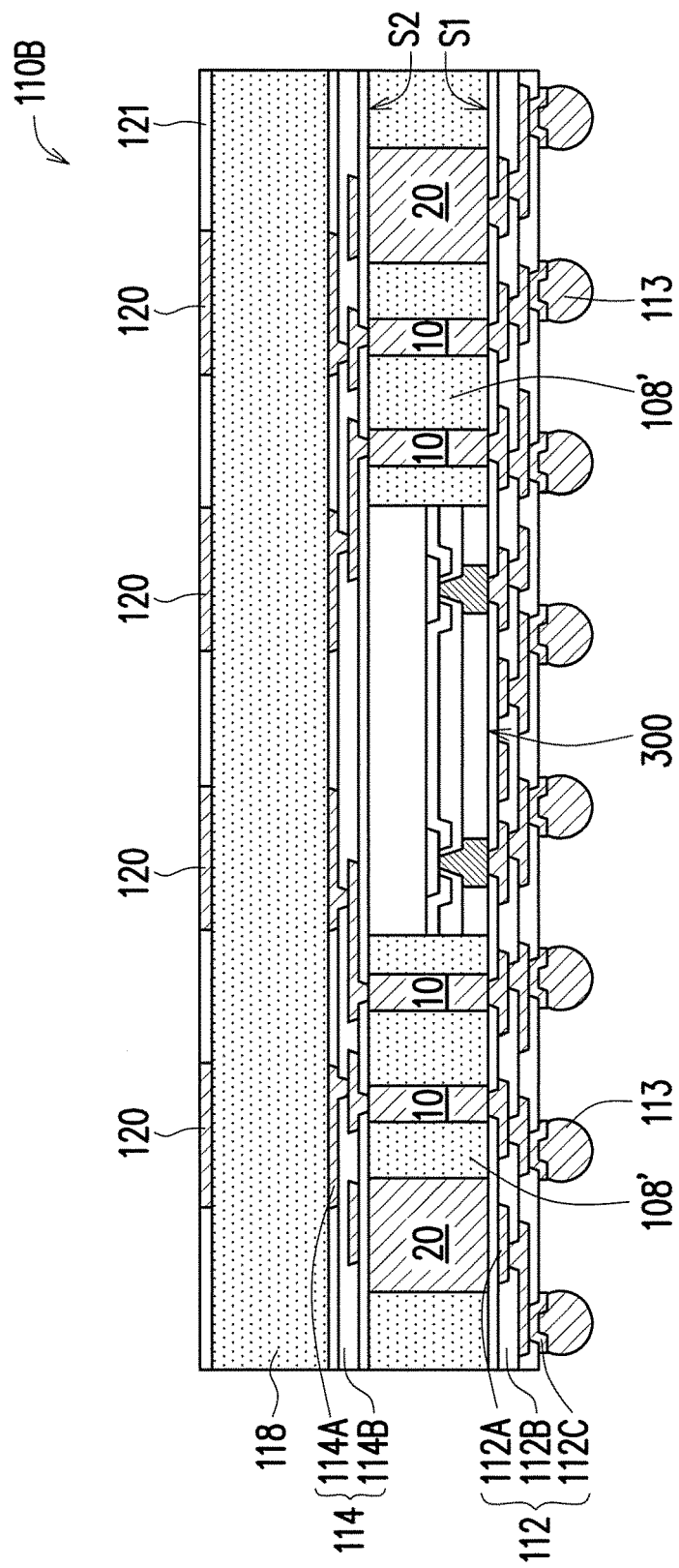

Referring to FIG. 3F, after forming the second redistribution layer 114, the second encapsulant 118 is formed on the second redistribution layer 114 to cover the second redistribution layer 114. In some embodiments, the second redistribution layer 114 is sandwiched between the insulating encapsulant 108' and the second encapsulant 118. In some embodiments, the second encapsulant 118 includes, for example, epoxy resins or any other suitable type of molding materials. In some embodiments, the material of the second encapsulant 118 has low permittivity (Dk) and low loss tangent (DO properties. Depending on the frequency range of high-speed applications, suitable materials of the second encapsulant 118 may be selected based on the required electrical properties of the integrated fan-out package 110B. In some embodiments, the material of the second encapsulant 118 can be the same as the material of the insulating encapsulant 108'. In an alternative embodiment, the material of the second encapsulant 118 can be different from the material of the insulating encapsulant 108', but the disclosure is not limited thereto.

After forming the second encapsulant 118, an antenna 120 is formed on the second encapsulant 118, and over the second redistribution layer 114. The antenna 120 is, for example, formed on the second encapsulant 118, on a side opposite to the second redistribution layer 114. In some embodiments, the antenna 120 may be electrically coupled to the conductive layers 114A of the second redistribution layer 114. In some embodiments, the conductive layers 114A may serve as a feed-line for the antenna 120. In alternative embodiments, the conductive layers 114A are electrically connected to the antenna 120 through feed-lines (not shown). In certain embodiments, the antenna 120 is, for example, a patch antenna having a plurality of antenna patterns (conductive patterns). The antenna patterns of the antenna 120 may, for example, be separated from one another by dielectric layer 121. However, in some alternative embodiments, the dielectric layer 121 may be omitted, while the antenna patterns of the antenna 120 are still separated from one another. In some embodiments, the antenna 120 is formed by forming a metallization layer (not shown) by electroplating or deposition over the second encapsulant 118 and then patterning the metallization layer by photolithographic and etching processes. In an alternative embodiment, the antenna 120 is formed by forming a metallization layer (not shown) by plating process. In some embodiments, the material of the metallization layer includes aluminum, titanium, copper, nickel, tungsten, and/ or alloys thereof. As shown in FIG. 3F, after forming the antenna 120, the integrated fan-out package 110B of the module 110 is accomplished.

Figure 3G:
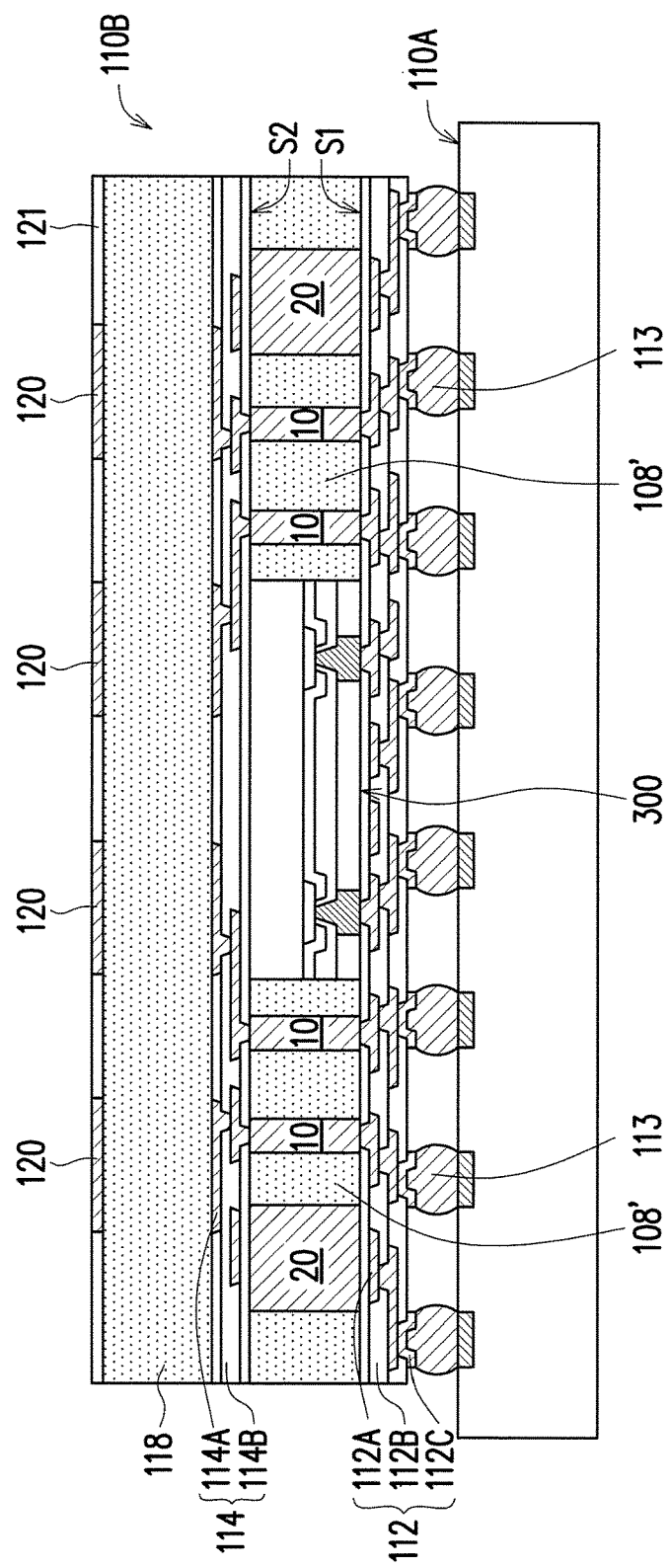

Referring to FIG. 3G, after forming the integrated fan-out package 110B, the integrated fan-out package 110B may be disposed onto a circuit substrate 110A. The circuit substrate 110A and the integrated fan-out package 110B together constitute the module 110. In some embodiments, the circuit substrate 110A is electrically connected to the semiconductor die 300 of the integrated fan-out package 110B through the second redistribution layer 114. In certain embodiments, the first surface S1 of the insulating encapsulant 108' is facing the circuit substrate 110a, whereas the second surface of the insulating encapsulant 108' is facing away from the circuit substrate 110a.

Referring back to FIG. 2, after forming the module 110 including the integrated fan-out package 110B and the circuit substrate 110A, a housing (200/200') is provided to cover the integrated fan-out package 110B, wherein the housing (200/200') is mechanically connected to the circuit substrate 110A. In some embodiments, the housing (200/200') is mechanically connected to the circuit substrate 110A through the housing side walls 200S in the way shown in the embodiment of FIG. 1A or FIG. 1B. In the illustrated embodiment of FIG. 2, the module 110 and the housing (200/200') together constitute an electronic apparatus of the disclosure. As shown in FIG. 2, in the electronic apparatus of the embodiment, a plurality of conductive patterns 202 is located on a surface X1 of the housing (200/200'), wherein the plurality of conductive patterns 202 is located in between the housing (200/200') and the integrated fan-out package 110B. In some embodiments, the conductive patterns 202 are metal coatings that are formed on the housing (200/200'). In certain embodiments, the conductive patterns 202 may serve as directors for the antenna 120, to enhance the performance of the antenna 120. In some embodiments, the position of the conductive patterns 202 substantially corresponds to a position of the antenna patterns of the antenna 120. That is, each of the conductive patterns 202 is in a face to face arrangement with each of the antenna patterns of the antenna 120. In some embodiments, a width W1 of each of the conductive patterns 202 is smaller than or substantially equal to a width W2 of each of the antenna patterns of the antenna 120. In the case where a conductive housing 200A having a dielectric window 200B is used (embodiment of FIG. 1B), a position of the dielectric window 200B may corresponds to a position of the antenna 120. That is, the portion of the housing 200' located above the antenna 120 is still made of dielectric materials.

In the embodiment shown in FIG. 2, the antenna 120 is located in between the insulating encapsulant 108' and the housing (200/200'). In certain embodiments, the antenna 120 is disposed on the second encapsulant 118, and in contact with the second encapsulant 118. Furthermore, a gap GP is located in between the housing (200/200') and the integrated fan-out package 110B. In the exemplary embodiment, the gap GP is located in between the antenna 120 and the plurality of conductive patterns 202. By having the antenna 120 of the integrated fan-out package 110B placed near the housing (200/200') with a gap GP therebetween, a performance of the antenna 120 may be improved.

FIG. 4A to FIG. 4D are schematic sectional views illustrating an electronic apparatus according to some exemplary embodiments of the present disclosure. The embodiment shown in FIGS. 4A-4D are similar to the embodiment shown in FIG. 2, therefore the same reference numerals are used to refer to the same or like parts, and its detailed description will be omitted herein.

Figure 4A:
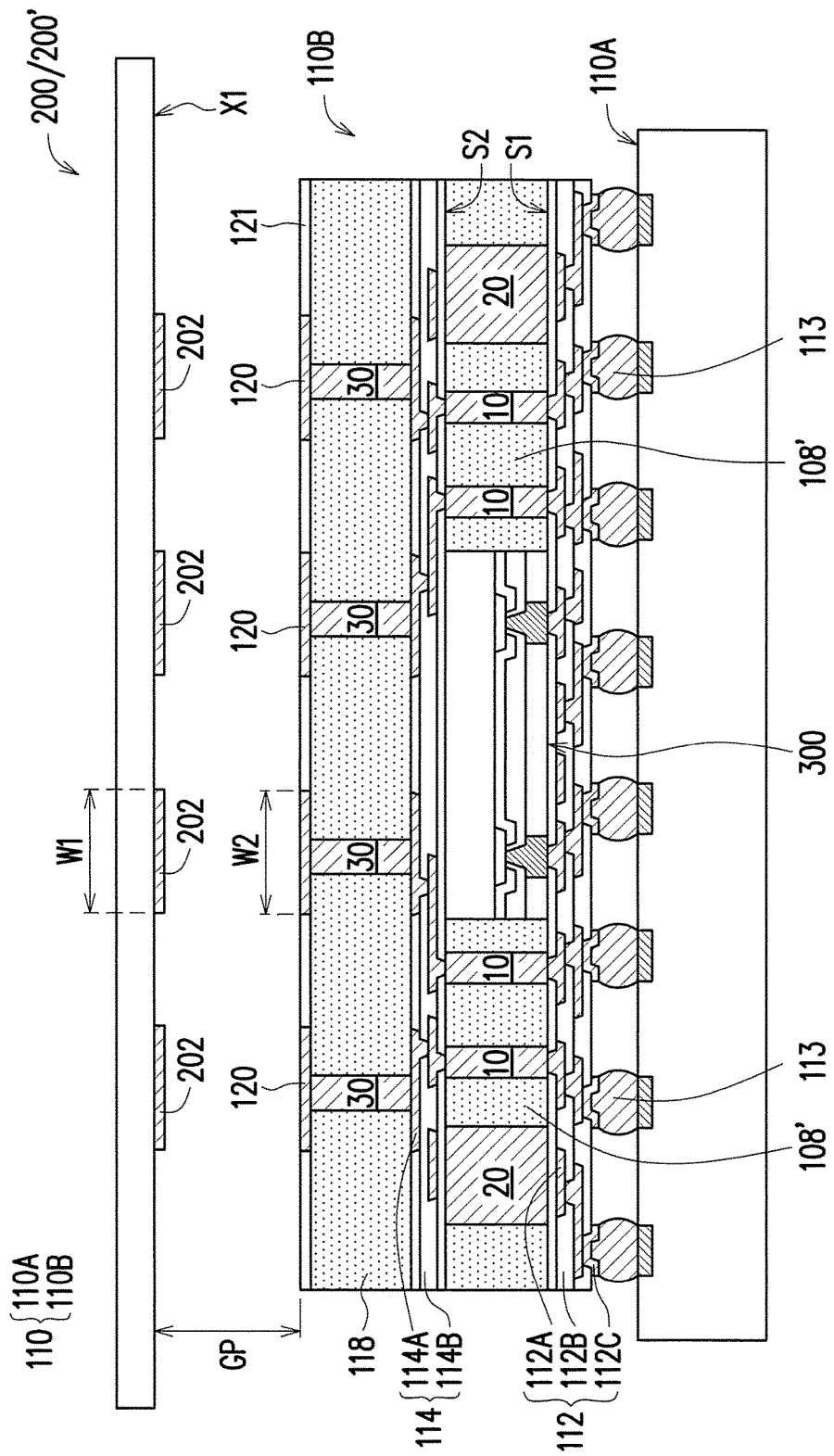
FIG. 4A to FIG. 4D are schematic sectional views illustrating an electronic apparatus according to some exemplary embodiments of the present disclosure.

Referring to FIG. 4A, the difference between the embodiment shown in FIG. 4A and FIG. 2 is that the integrated fan out package 110B of FIG. 4A further includes a plurality of conductive vias 30. The conductive vias 30 are encapsulated by the second encapsulant 118, and the conductive layers 114A of the second redistribution layer 114 are electrically coupled to the antenna 120 through these conductive vias 30.

Figure 4B:
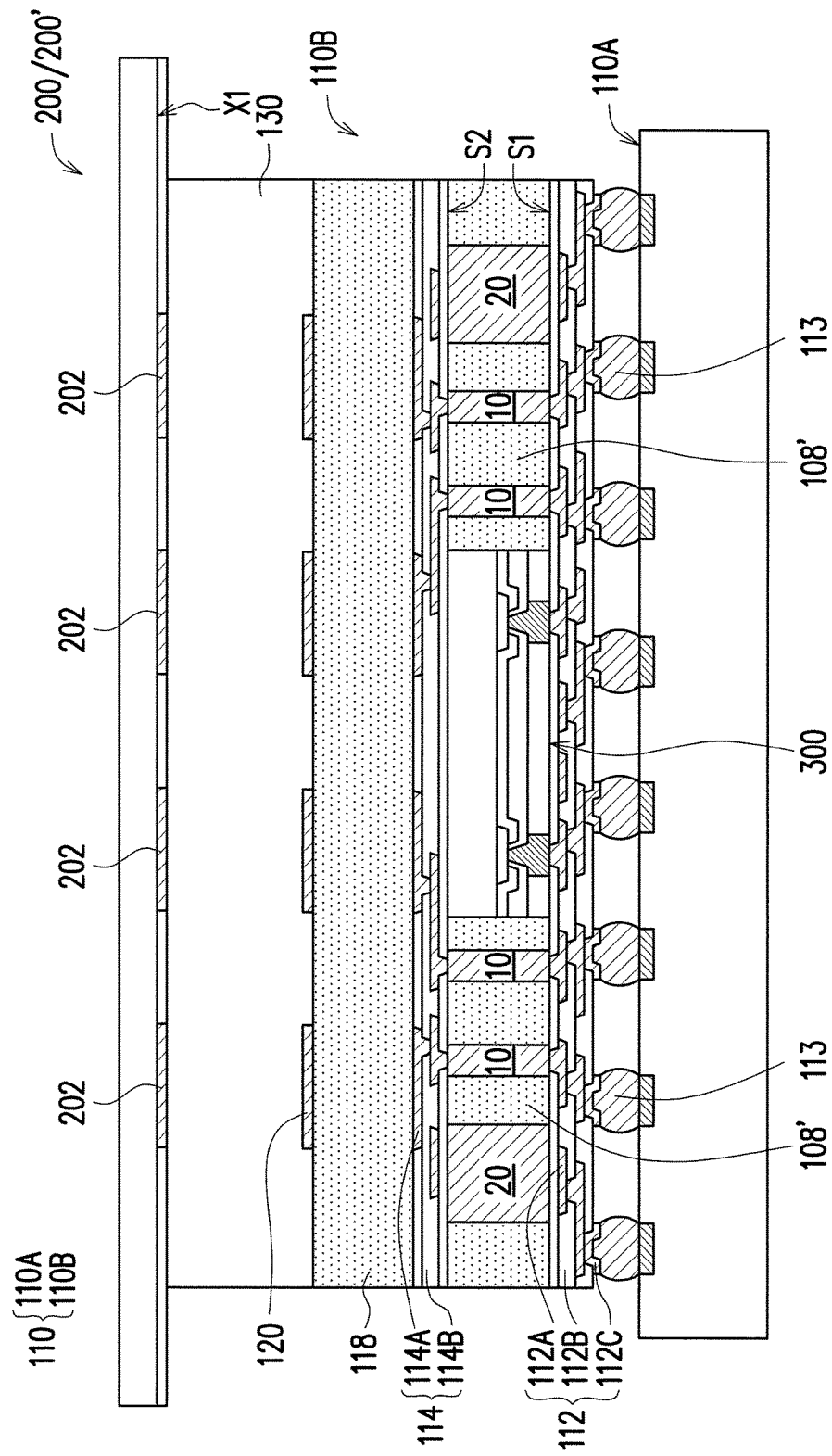

Referring to FIG. 4B, the difference between the embodiment shown in FIG. 4B and FIG. 2 is that a dielectric layer 130 is further formed to fill the gap GP (shown in FIG. 2) located in between the housing (200/200') and the integrated fan-out package 110B. That is, in some embodiments, the dielectric layer 130 may be sandwiched in between the second encapsulant 118 and the housing (200/200'), so as to fix the position of the module 110 and to provide support to the housing (200/200').

Figure 4C:
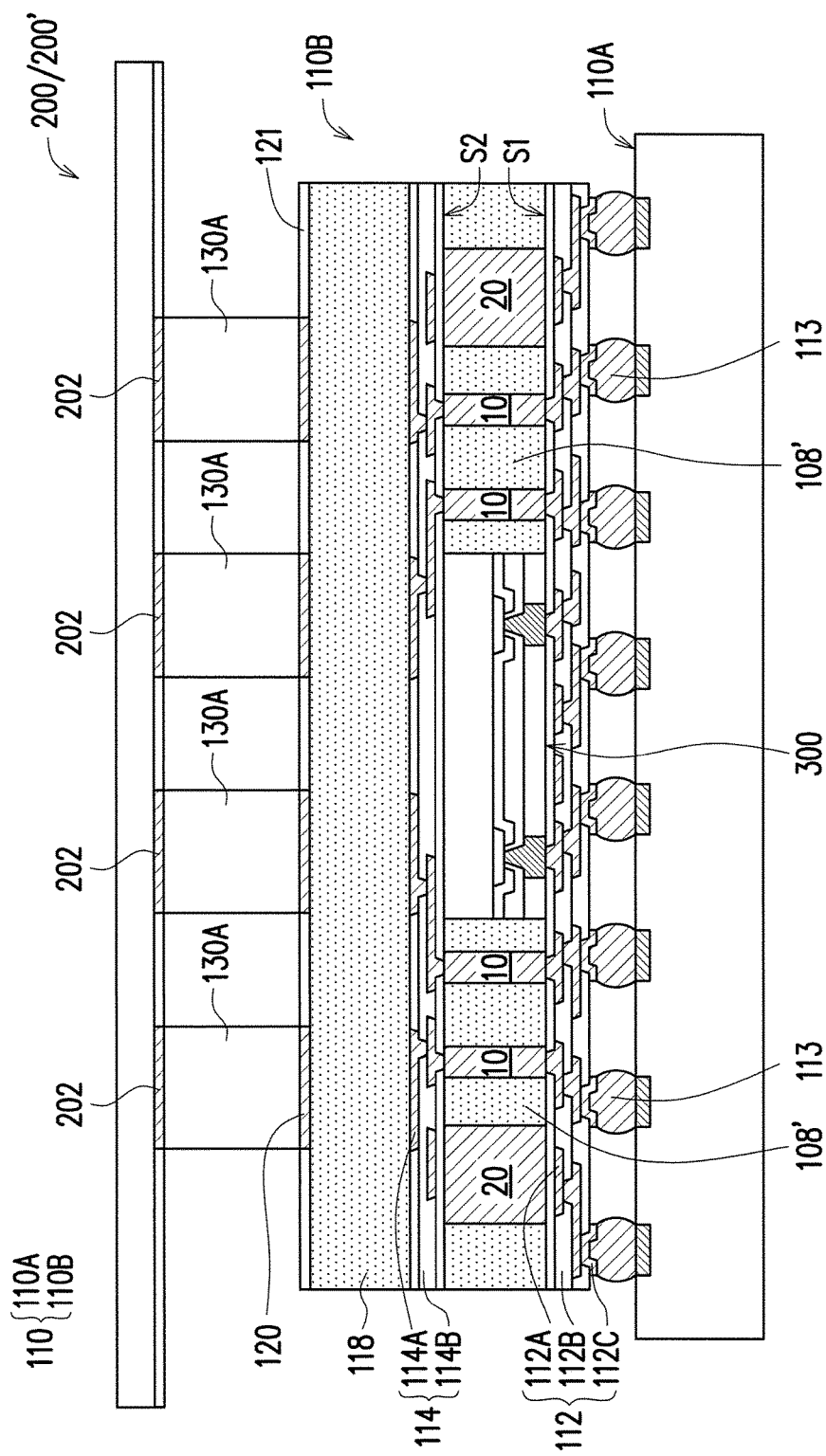

Referring to FIG. 4C, the difference between the embodiment shown in FIG. 4C and FIG. 2 is that a dielectric layer 130A with discrete patterns are formed to fill parts of the gap GP (shown in FIG. 2) located in between the housing (200/200') and the integrated fan-out package 110B. That is, in some embodiments, dielectric layer 130A with post-like structures may be formed in between the antenna 120 and the conductive patterns 202, so as to fix the position of the module 110 and to provide support to the housing (200/200'). In the embodiment shown in FIG. 4C, although conductive patterns 202 are illustrated, however, in some alternative embodiments, the conductive patterns 202 may be omitted based on requirement.

Figure 4D:
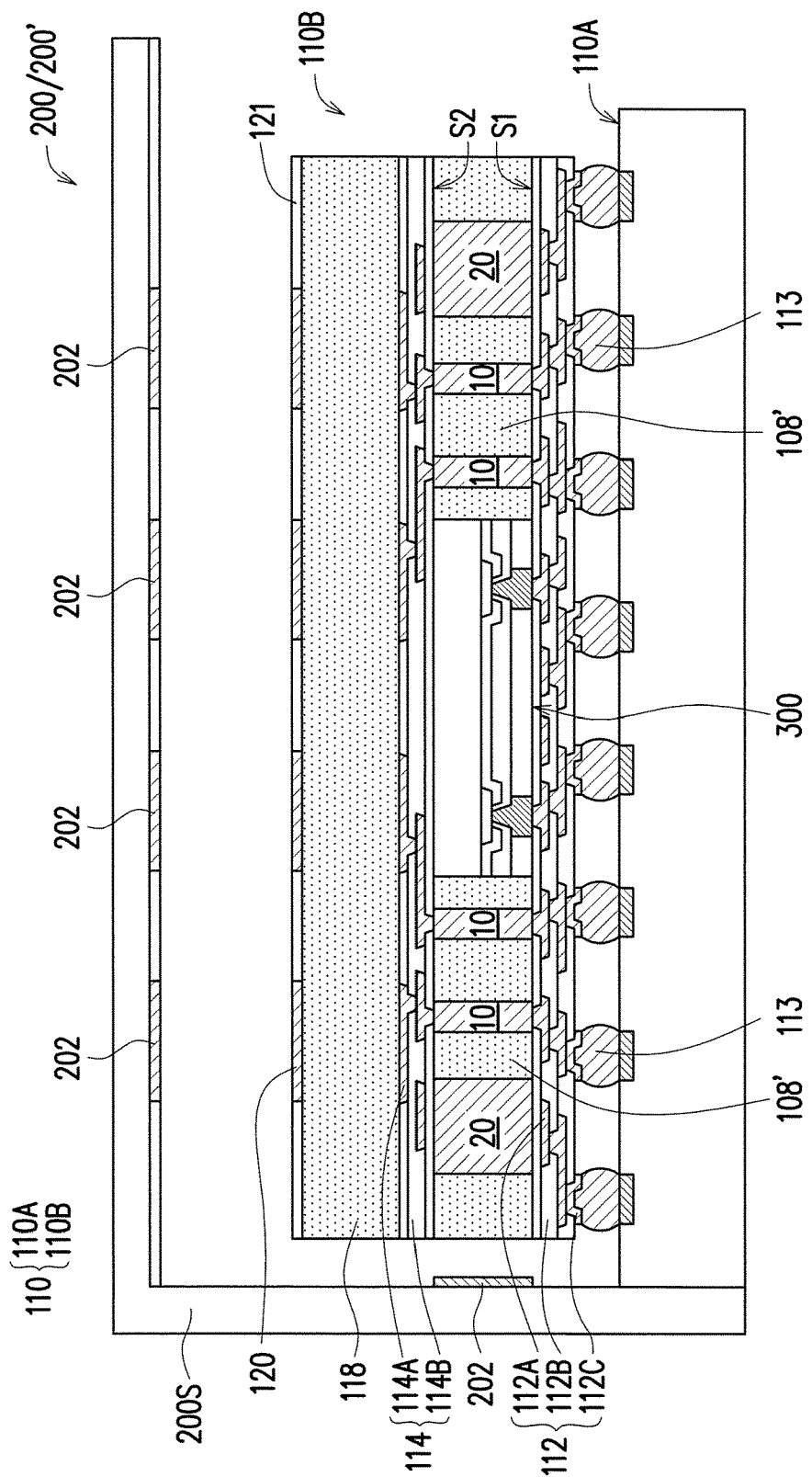

Referring to FIG. 4D, the difference between the embodiment shown in FIG. 4D and FIG. 2 is that the conductive patterns 202 are further formed on the housing side walls 200S of the housing 200. For example, in some embodiments, the conductive patterns 202 may be formed on the housing side walls 200S so that the conductive patterns 202 may serve as directors for the antenna 20 of the closest module 110, to enhance the performance of the antenna 20.

Figure 5:
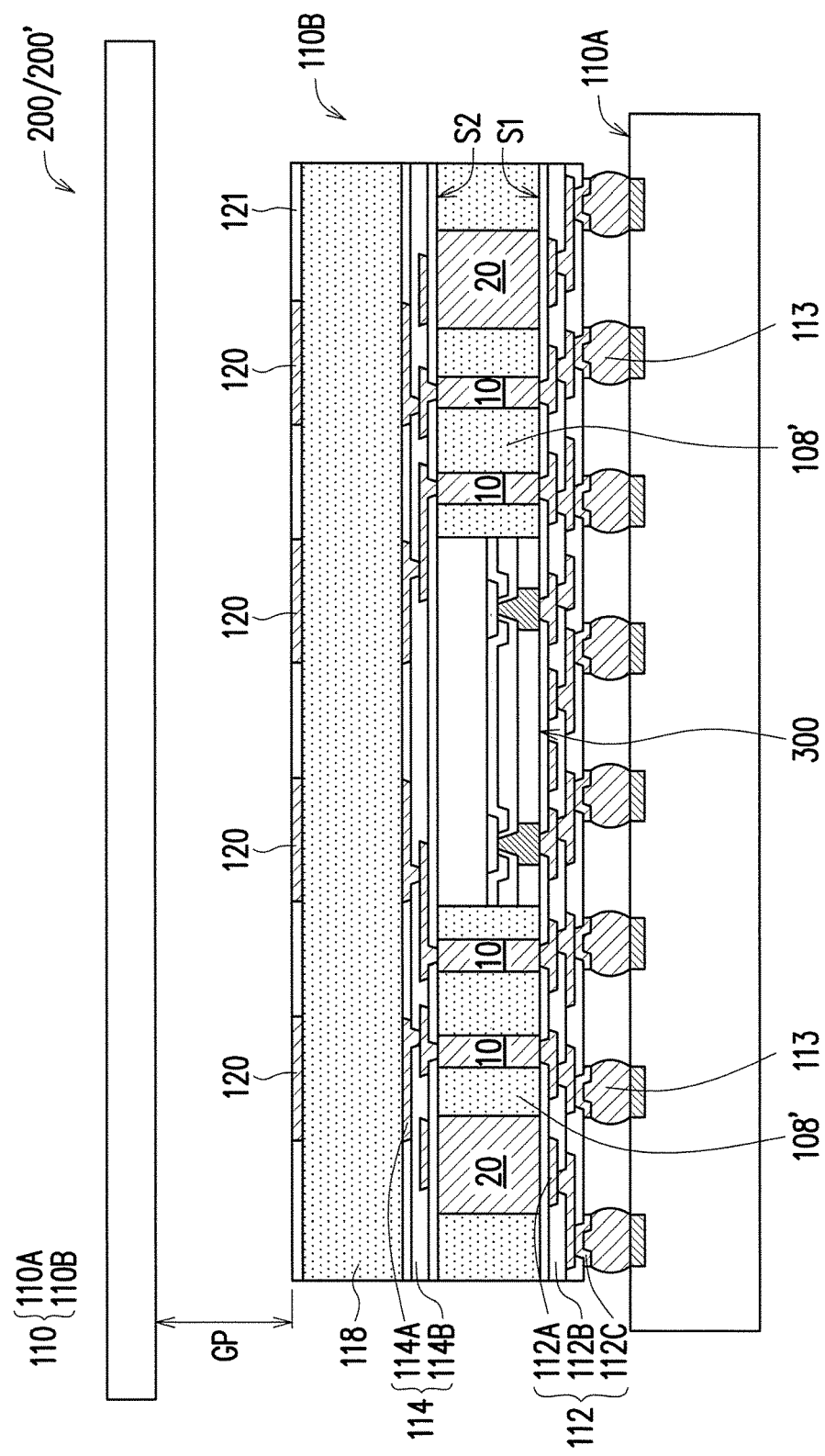
FIG. 5 is a schematic sectional view illustrating an electronic apparatus according to some other exemplary embodiments of the present disclosure.

FIG. 5 is a schematic sectional view illustrating an electronic apparatus according to some other exemplary embodiments of the present disclosure. The embodiment shown in FIG. 5 is similar to the embodiment shown in FIG. 2, hence the same reference numerals are used to refer to the same or like parts, and detailed description thereof will be omitted herein. The main difference between the embodiment of FIG. 5 and the embodiment of FIG. 2 is that the housing (200/200') of FIG. 5 do not have conductive patterns 202 located on a surface of the housing (200/200'). In the exemplary embodiment, the housing (dielectric housing 200 or dielectric window 200B of housing 200') still covers the integrated fan-out package 110B. By having the antenna 120 of the integrated fan-out package 110B placed near the housing (200/200') with a gap GP therebetween, a performance of the antenna 120 may be improved.

Figure 6A:
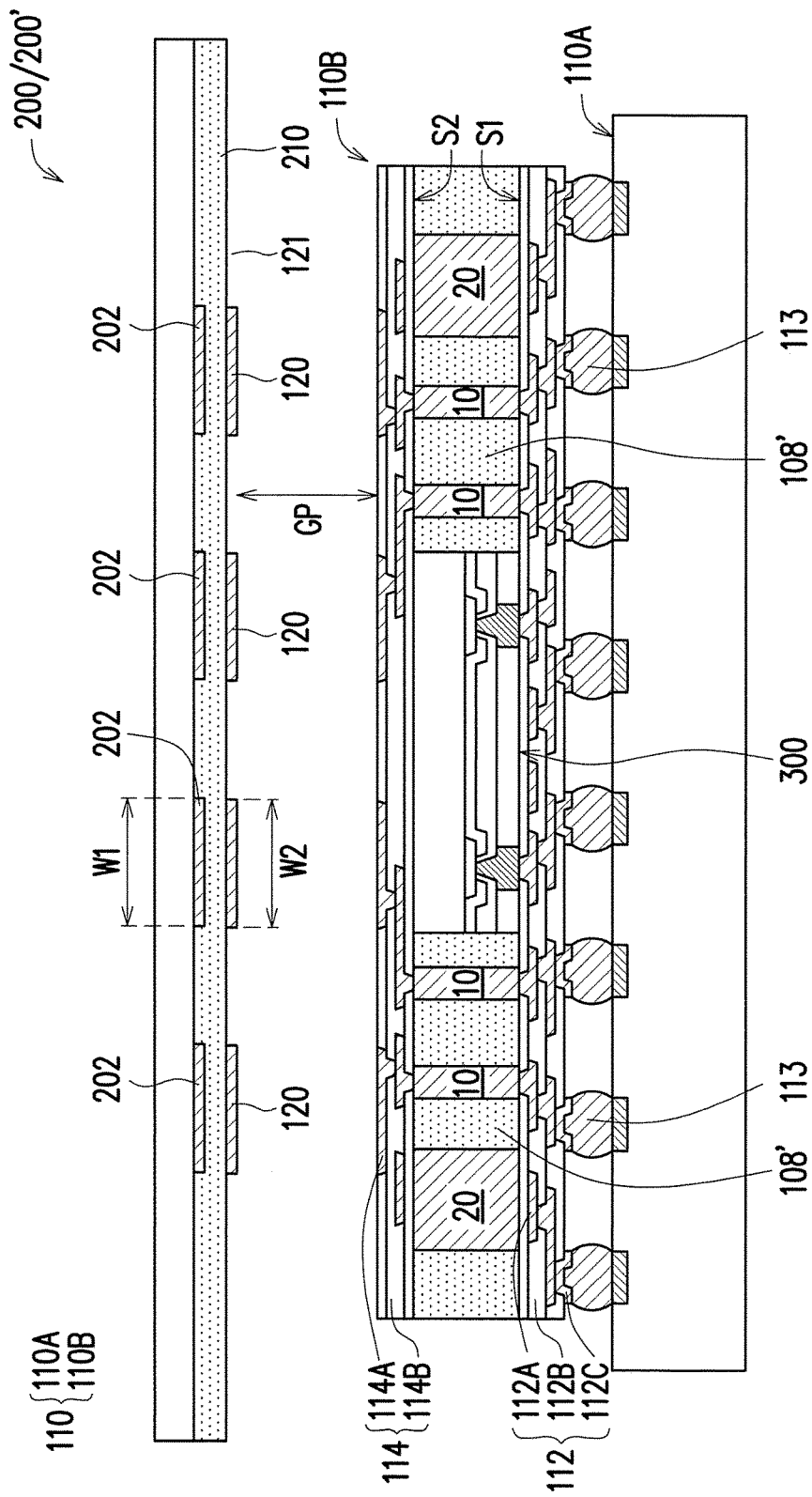
FIG. 6A to FIG. 6D are schematic sectional views illustrating an electronic apparatus according to some other exemplary embodiments of the present disclosure.

FIG. 6A is a schematic sectional view illustrating an electronic apparatus according to some other exemplary embodiments of the present disclosure. The embodiment shown in FIG. 6A is similar to the embodiment shown in FIG. 2, hence the same reference numerals are used to refer to the same or like parts, and detailed description thereof will be omitted herein. As shown in FIG. 6A, the main difference between the embodiment of FIG. 6A and the embodiment of FIG. 2 is in the position of the antenna 120. In the embodiment of FIG. 6A, the electronic apparatus further includes a dielectric layer 210 disposed on the surface X1 of the housing (200/200'). The antenna 120 is disposed on the housing (200/200'), wherein the antenna 120 and the plurality of conductive patterns 202 are spaced apart by the dielectric layer 210. In the exemplary embodiment, the antenna 120 is located on the housing (200/200'), therefore, a second encapsulant 118 is omitted from the integrated fan-out package 110B. That is, in some embodiments, the steps shown in FIG. 3A to FIG. 3E are sufficient to accomplish an integrated fan-out package 110B of FIG. 6A. As shown in FIG. 6A, a gap GP is located in between the housing (200/200') and the integrated fan-out package 110B. In the exemplary embodiment, the gap GP is located in between the antenna 120 and the integrated fan-out package 110B. In certain embodiments, the gap GP is located in between the antenna 120 and the second redistribution layer 114.

Similarly, in the embodiment of FIG. 6A, the antenna 120 may be electrically coupled to the conductive layers 114A of the second redistribution layer 114. In some embodiments, the conductive layers 114A may serve as a feed-line for the antenna 120. In alternative embodiments, the conductive layers 114A are electrically connected to the antenna 120 through feed-lines (not shown). In some embodiments, the conductive patterns 202 may serve as directors for the antenna 120, to enhance the performance of the antenna 120. By having the antenna 120 placed near the housing (200/200') with a gap GP between the antenna 120 and the integrated fan-out package 110B, a performance of the antenna 120 may be improved.

Figure 6B:
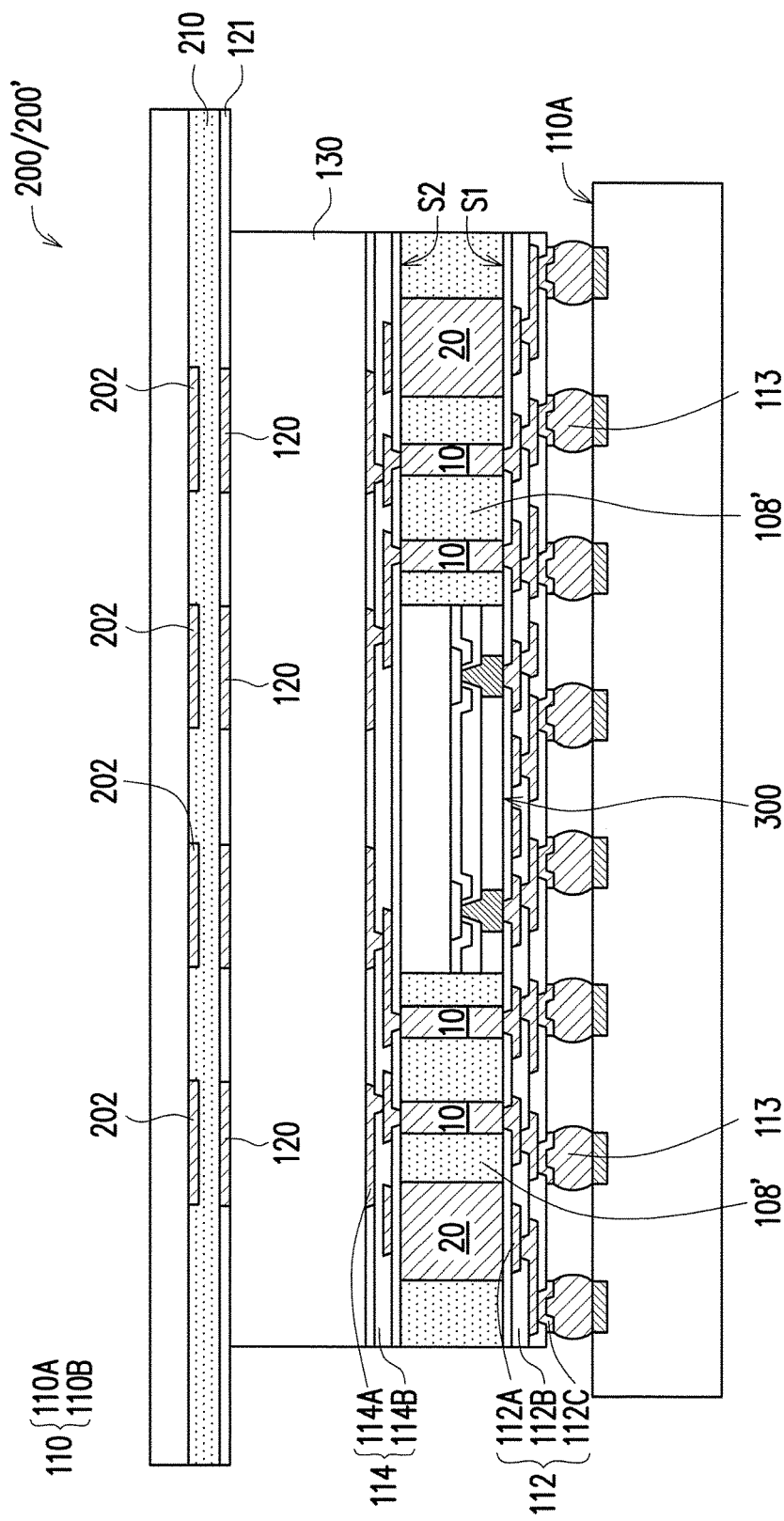
Figure 6C:
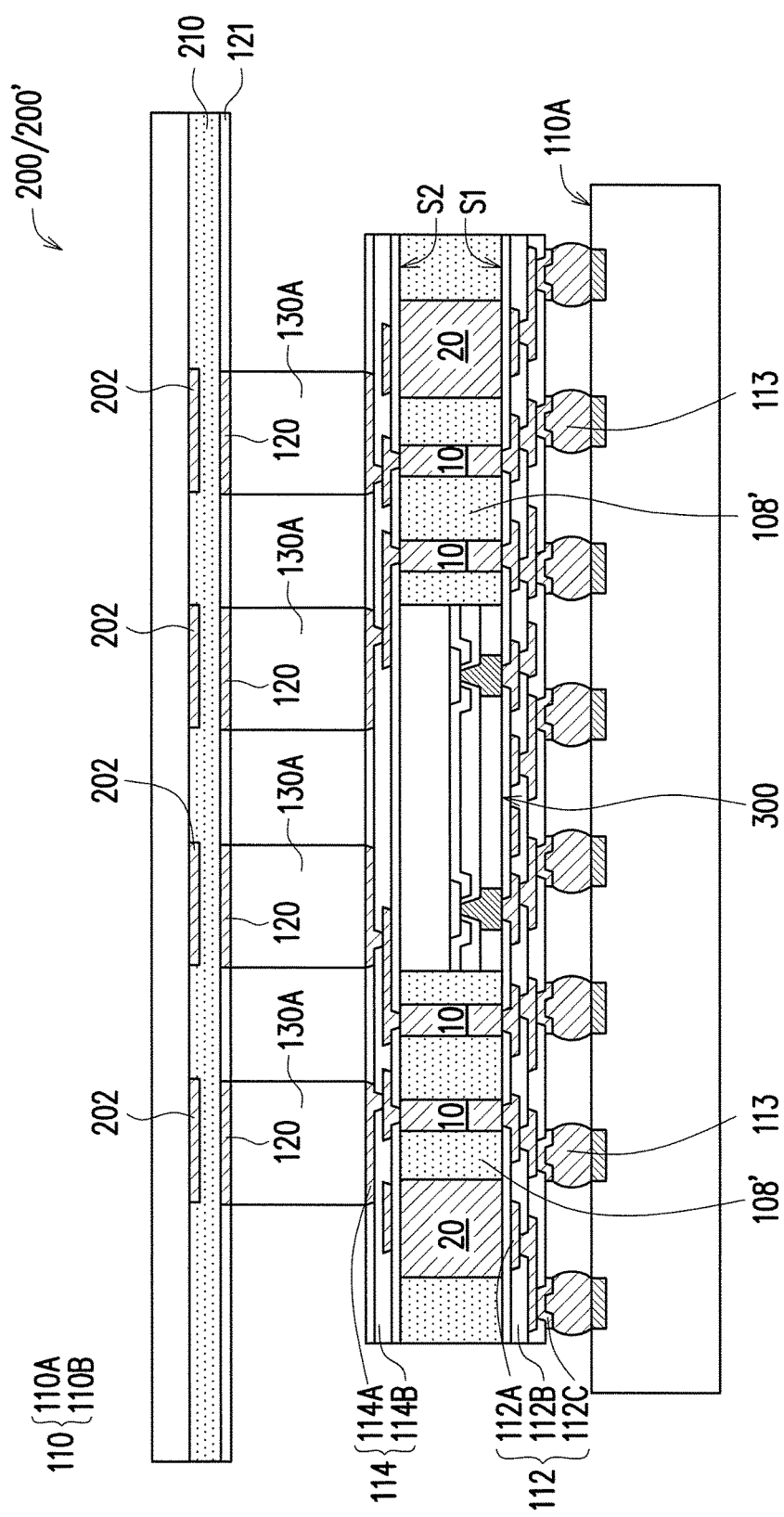
Figure 6D:
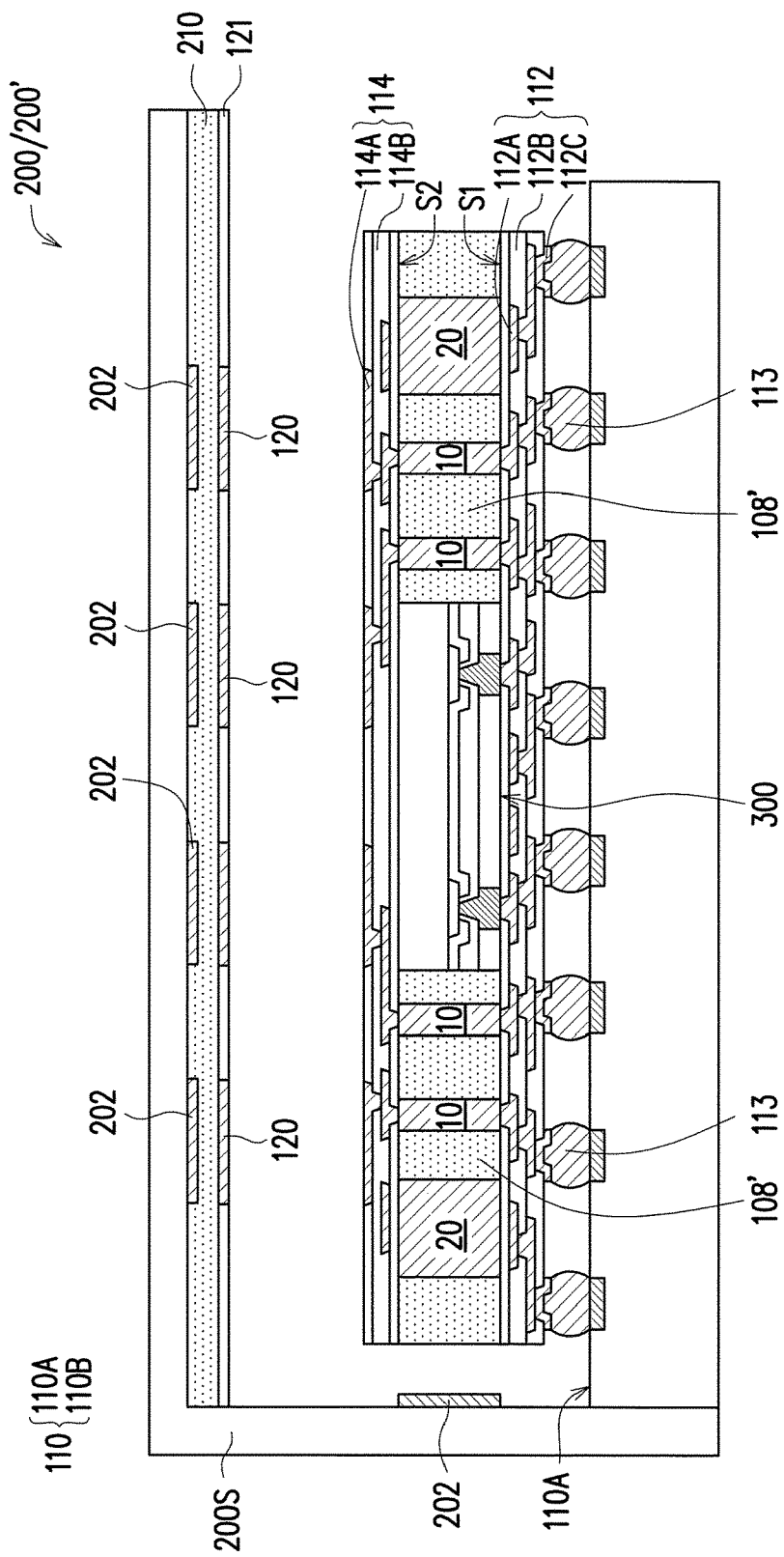

FIG. 6B to FIG. 6D are schematic sectional views illustrating an electronic apparatus according to some exemplary embodiments of the present disclosure. The embodiment shown in FIGS. 6B-6D are similar to the embodiment shown in FIG. 6A, therefore the same reference numerals are used to refer to the same or like parts, and its detailed description will be omitted herein.

Referring to FIG. 6B, the difference between the embodiment shown in FIG. 6B and FIG. 6A is that a dielectric layer 130 is further formed to fill the gap GP (shown in FIG. 6A) located in between the housing (200/200') and the integrated fan-out package 110B. That is, in some embodiments, the dielectric layer 130 may be sandwiched in between the second redistribution layer 114 and the housing (200/200'), so as to fix the position of the module 110 and to provide support to the housing (200/200').

Referring to FIG. 6C, the difference between the embodiment shown in FIG. 6C and FIG. 6A is that a dielectric layer 130A with discrete patterns are formed to fill parts of the gap GP (shown in FIG. 6A) located in between the housing (200/200') and the integrated fan-out package 110B. That is, in some embodiments, dielectric layer 130A with post-like structures may be formed in between the antenna 120 and the conductive layers 114A, so as to fix the position of the module 110 and to provide support to the housing (200/200').

Referring to FIG. 6D, the difference between the embodiment shown in FIG. 6D and FIG. 6A is that the conductive patterns 202 are further formed on the housing side walls 200S of the housing 200. For example, in some embodiments, the conductive patterns 202 may be formed on the housing side walls 200S so that the conductive patterns 202 may serve as directors for the antenna 20 of the closest module 110, to enhance the performance of the antenna 20.

In the embodiments mentioned above, the housing made of dielectric material (or portions made of dielectric material) are placed above the antenna. As such, the performance of the antennas will not be affected by metal materials as used in conventional housings. Furthermore, by having the conductive patterns serving as directors, the performance of the antennas can be further improved. Overall, an electronic apparatus having better antenna performance can be achieved without impacting the size and cost of the apparatus.

An embodiment of the invention provides an electronic apparatus comprising an integrated fan-out package, a dielectric housing and a plurality of conductive patterns. The dielectric housing is covering the integrated fan-out package, wherein a gap or a first dielectric layer is in between the dielectric housing and the integrated fan-out package. The plurality of conductive patterns is located on a surface of the dielectric housing, wherein the plurality of conductive patterns is located in between the dielectric housing and the integrated fan-out package.

Another embodiment of the invention provides an electronic apparatus comprising a module, a housing and a plurality of conductive patterns. The module comprises an integrated fan-out package and a circuit substrate electrically connected to the integrated fan-out package. The integrated fan-out package comprises at least one semiconductor die and an insulating encapsulant. The insulating encapsulant is encapsulating the at least one semiconductor die, the insulating encapsulant have a first surface facing the circuit substrate and a second surface facing away from the circuit substrate. The housing is covering the integrated fan-out package and connected to the circuit substrate, wherein the housing comprises a dielectric window, and a gap or a first dielectric layer is in between the dielectric window of the housing and the integrated fan-out package. The plurality of conductive patterns is attached to a surface of the housing, wherein the plurality of conductive patterns is located in between the housing and the integrated fan-out package.

Yet another embodiment of the invention provides an electronic apparatus comprising a module, a dielectric housing, a plurality of conductive patterns and an antenna. The module having an integrated fan-out package and a circuit substrate. The integrated fan-out package comprises at least one semiconductor die, an insulating encapsulant, a first redistribution layer and a second redistribution layer. The insulating encapsulant is encapsulating the at least one semiconductor die, and the insulating encapsulant have a first surface and a second surface opposite to the first surface. The first redistribution layer is located on the first surface of the insulating encapsulant, wherein the circuit substrate is electrically connected to the first redistribution layer and the at least one semiconductor die. The second redistribution layer is located on the second surface of the insulating encapsulant. The dielectric housing is covering the integrated fan-out package and connected to the circuit substrate. The dielectric housing is facing the second redistribution layer of the integrated fan-out package, wherein a gap or a first dielectric layer is in between the dielectric housing and the integrated fan-out package. The plurality of conductive patterns is disposed on a surface of the dielectric housing, wherein the plurality of conductive patterns is located in between the dielectric housing and the integrated fan-out package. The antenna is located in between the second redistribution layer and the plurality of conductive patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic apparatus, comprising:
    an integrated fan-out package;
    a dielectric housing covering the integrated fan-out package, wherein a gap or a first dielectric layer is in between the dielectric housing and the integrated fan-out package;
    a plurality of conductive patterns located on a surface of the dielectric housing, wherein the plurality of conductive patterns is located in between the dielectric housing and the integrated fan-out package.

2. The electronic apparatus according to claim 1, further comprising:
    a circuit substrate, wherein the integrated fan-out package is located in between the circuit substrate and the dielectric housing, and the dielectric housing is mechanically connected to the circuit substrate.

3. The electronic apparatus according to claim 2, wherein the integrated fan-out package comprises:
    at least one semiconductor die; and
    an insulating encapsulant encapsulating the at least one semiconductor die, the insulating encapsulant have a first surface facing the circuit substrate and a second surface opposite to the first surface.

4. The electronic apparatus according to claim 3, wherein the integrated fan-out package further comprises an antenna located in between the insulating encapsulant and the dielectric housing.

5. The electronic apparatus according to claim 4, wherein the antenna is disposed on the second surface of the insulating encapsulant, and the gap or the first dielectric layer is in between the antenna and the plurality of conductive patterns.

6. The electronic apparatus according to claim 4 further comprising a second dielectric layer disposed on the surface of the dielectric housing, wherein the antenna is disposed on the dielectric housing, the antenna and the plurality of conductive patterns are spaced apart by the second dielectric layer, and the gap or the first dielectric layer is in between the antenna and the integrated fan-out package.

7. The electronic apparatus according to claim 4, wherein the antenna comprises a patch antenna comprising a plurality of antenna patterns, and a width of each of the conductive patterns is smaller than or substantially equal to a width of each of the antenna patterns.

8. The electronic apparatus according to claim 1, wherein the plurality of conductive patterns is further located on housing side walls of the dielectric housing.

9. An electronic apparatus, comprising:
a module comprising an integrated fan-out package and a circuit substrate electrically connected to the integrated fan-out package, the integrated fan-out package comprising:
at least one semiconductor die;
an insulating encapsulant encapsulating the at least one semiconductor die, the insulating encapsulant have a first surface facing the circuit substrate and a second surface facing away from the circuit substrate;
a housing covering the integrated fan-out package and connected to the circuit substrate, wherein the housing comprises a dielectric window, and a gap or a first dielectric layer is in between the dielectric window of the housing and the integrated fan-out package;
a plurality of conductive patterns attached to a surface of the housing, wherein the plurality of conductive patterns is located in between the housing and the integrated fan-out package.

10. The electronic apparatus according to claim 9, further comprising an antenna located in between the insulating encapsulant and the dielectric window.

11. The electronic apparatus according to claim 10, wherein the housing comprises a conductive housing having the dielectric window, a position of the dielectric window corresponds to a position of the antenna, and the plurality of conductive patterns is attached to the surface of the dielectric window.

12. The electronic apparatus according to claim 10, wherein the housing is a dielectric housing.

13. The electronic apparatus according to claim 10, wherein the antenna is disposed on the second surface of the insulating encapsulant, and the gap or the first dielectric layer is in between the antenna and the plurality of conductive patterns.

14. The electronic apparatus according to claim 10, further comprising a second dielectric layer disposed on the surface of the housing, wherein the antenna is disposed on the housing, the antenna and the plurality of conductive patterns are spaced apart by the second dielectric layer, and the gap or the first dielectric layer is in between the antenna and the integrated fan-out package.

15. The electronic apparatus according to claim 10, wherein the antenna comprises a patch antenna comprising a plurality of antenna patterns, and a width of each of the conductive patterns is smaller than or substantially equal to a width of each of the antenna patterns.

16. The electronic apparatus according to claim 9, wherein the plurality of conductive patterns is further located on housing side walls of the dielectric housing.

17. An electronic apparatus, comprising:
a module having an integrated fan-out package and a circuit substrate, wherein the integrated fan-out package comprises:
at least one semiconductor die;
an insulating encapsulant encapsulating the at least one semiconductor die, the insulating encapsulant have a first surface and a second surface opposite to the first surface;
a first redistribution layer located on the first surface of the insulating encapsulant, wherein the circuit substrate is electrically connected to the first redistribution layer and the at least one semiconductor die; and
a second redistribution layer located on the second surface of the insulating encapsulant;
a dielectric housing covering the integrated fan-out package and connected to the circuit substrate, the dielectric housing is facing the second redistribution layer of the integrated fan-out package, wherein a gap or a first dielectric layer is in between the dielectric housing and the integrated fan-out package;
a plurality of conductive patterns disposed on a surface of the dielectric housing, wherein the plurality of conductive patterns is located in between the dielectric housing and the integrated fan-out package; and
an antenna located in between the second redistribution layer and the plurality of conductive patterns.

18. The electronic apparatus according to claim 17, further comprising a second encapsulant disposed on the second redistribution layer, wherein the antenna is disposed on the second encapsulant, and the gap or the first dielectric layer is in between the antenna and the plurality of conductive patterns.

19. The electronic apparatus according to claim 17, further comprising a second dielectric layer disposed on the surface of the dielectric housing, wherein the antenna is disposed on the dielectric housing, the antenna and the plurality of conductive patterns are spaced apart by the second dielectric layer, and the gap or the first dielectric layer is in between the antenna and the second redistribution layer.

20. The electronic apparatus according to claim 17, wherein the antenna comprises a patch antenna comprising a plurality of antenna patterns.

* * * * *